(12) United States Patent
Huang et al.

(10) Patent No.: US 12,302,675 B2
(45) Date of Patent: May 13, 2025

(54) SEMICONDUCTOR LIGHT-EMITTING DEVICE

(71) Applicant: Quanzhou Sanan Semiconductor Technology Co., Ltd., Quanzhou (CN)

(72) Inventors: Zhaowu Huang, Fujian (CN); Chang-Chin Yu, Fujian (CN); Li Yang, Fujian (CN); Chenxi Yan, Fujian (CN); Xinglong Li, Fujian (CN); Yang Li, Fujian (CN)

(73) Assignee: QUANZHOU SANAN SEMICONDUCTOR TECHNOLOGY CO., LTD., Fujian (CN)

( * ) Notice: Subject to any disclaimer, the term of this patent is extended or adjusted under 35 U.S.C. 154(b) by 435 days.

(21) Appl. No.: 17/744,351

(22) Filed: May 13, 2022

(65) Prior Publication Data

US 2022/0376154 A1    Nov. 24, 2022

(30) Foreign Application Priority Data

May 18, 2021    (CN) .......................... 202110537279.7

(51) Int. Cl.
*H01L 33/62*    (2010.01)
*H10H 20/856*    (2025.01)
*H10H 20/857*    (2025.01)

(52) U.S. Cl.
CPC ........ *H10H 20/857* (2025.01); *H10H 20/856* (2025.01)

(58) Field of Classification Search
None
See application file for complete search history.

(56) References Cited

FOREIGN PATENT DOCUMENTS

| CN | 200993968 Y | 12/2007 |
|----|-------------|---------|
| CN | 102544318 A | 7/2012  |
| CN | 106979503 A | 7/2017  |
| CN | 207690828 U | 8/2018  |

OTHER PUBLICATIONS

Machine Translation of CN 207690828 (Year: 2018).*
Machine Translation of CN 200993968 (Year: 2007).*
Search Report appended to an Office Action, which was issued to Chinese counterpart application No. 202110537279.7 by the CNIPA on Feb. 23, 2022 with an English translation thereof.

* cited by examiner

*Primary Examiner* — Anthony Ho
(74) *Attorney, Agent, or Firm* — MUNCY, GEISSLER, OLDS & LOWE, P.C.

(57) ABSTRACT

A semiconductor light-emitting device includes a lead frame, a light-emitting element, and a reflection layer. The lead frame includes a main body and a side body extending upwardly from the main body. The main body and the side body cooperatively define a receiving space. The side body has an inner surface facing the receiving space, and a first height measured from a surface of the main body. The light-emitting element is disposed on the surface of the main body and in the receiving space. The reflection layer covers at least a part of the inner surface, and has a second height measured from the surface of the main body. The second height is not smaller than 90% of the first height.

20 Claims, 2 Drawing Sheets

SEMICONDUCTOR LIGHT-EMITTING DEVICE

CROSS-REFERENCE TO RELATED APPLICATION

This application claims priority of Chinese Invention Patent Application No. 202110537279.7, filed on May 18, 2021.

FIELD

The disclosure relates to a semiconductor device, and more particularly to a semiconductor light-emitting device.

BACKGROUND

A semiconductor light-emitting device has been widely applied in a computer, a liquid crystal display (LCD), a LCD television and a lighting device due to various advantages, such as low power consumption, high luminous efficiency, long service life, and being eco-friendly. At present, enhanced performances of the semiconductor light-emitting device are sought, in particular, an excellent luminous efficiency. The semiconductor light-emitting device includes a lead frame and a light-emitting element, and the lead frame has a mounting trench for receiving the light-emitting element. When the light-emitting element is disposed in the mounting trench, light emitted from the light-emitting element is partially absorbed by the lead frame, thereby lowering the luminous efficiency of the semiconductor light-emitting device.

In order to prevent light emitted from the light-emitting element from being partially absorbed by the lead frame, a reflection layer is generally formed on a trench-defining sidewall of the lead frame. Since the trench-defining sidewall has a large and uniform slope, the reflection layer might only cover a part of the trench-defining sidewall and usually has a height not greater than 60% of a height of the trench-defining sidewall. Thus, light emitted from the light-emitting element might still be partially absorbed by the lead frame, thereby adversely affecting the luminous efficiency of the semiconductor light-emitting device.

SUMMARY

An object of the disclosure is to provide a semiconductor light-emitting device which can alleviate or overcome the aforesaid shortcomings of the prior art.

According to a first aspect of the disclosure, a semiconductor light-emitting device includes a lead frame, a light-emitting element, and a reflection layer.

The lead frame includes a main body and a side body extending upwardly from the main body. The main body and the side body cooperatively define a receiving space. The side body has an inner surface facing the receiving space, and has a first height measured from a surface of the main body.

The light-emitting element is disposed on the surface of the main body and in the receiving space.

The reflection layer covers at least a part of the inner surface, and has a second height measured from the surface of the main body. The second height is not smaller than 90% of the first height of the side body.

According to a second aspect of the disclosure, a semiconductor light-emitting device includes a lead frame, a light-emitting element, and a reflection layer.

The lead frame includes a main body and a side body extending upwardly from the main body. The main body and the side body cooperatively define a receiving space. The side body has an inner surface facing the receiving space, and a first height measured from a surface of the main body. The inner surface has a curved portion that has a slope increasing gradually in a direction from the main body to a topmost end of the side body, and that has a height defined between a topmost end of the curved portion and a bottommost end of the curved portion. The slope at 50% of the height of the curved portion ranges from tan 40° to tan 60°.

The light-emitting element is disposed on the surface of the main body and in the receiving space.

The reflection layer covers at least a part of the inner surface, and has a second height measured from the surface of the main body. The second height is not smaller than 90% of the first height of the side body.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
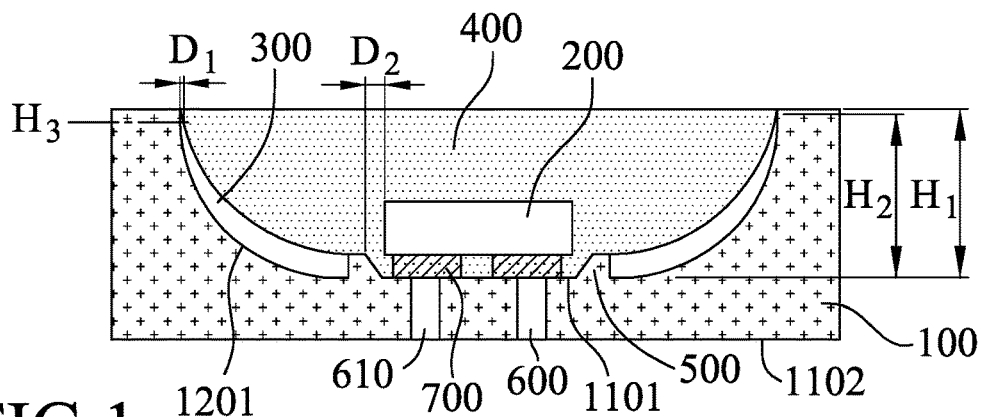
FIG. 1 is a schematic view illustrating a first embodiment of a semiconductor light-emitting device according to the disclosure.

Before the disclosure is described in greater detail, it should be noted that where considered appropriate, reference numerals have been repeated among the figures to indicate corresponding or analogous elements, which may optionally have similar characteristics.

It should be noted that, directional terms, such as "vertical," "horizontal," "top," "bottom," "upper," and "lower," may be used to assist in describing the disclosure based on the orientation of the embodiments shown in the figures. The use of these directional definitions should not be interpreted to limit the disclosure in any way.

Figure 2:
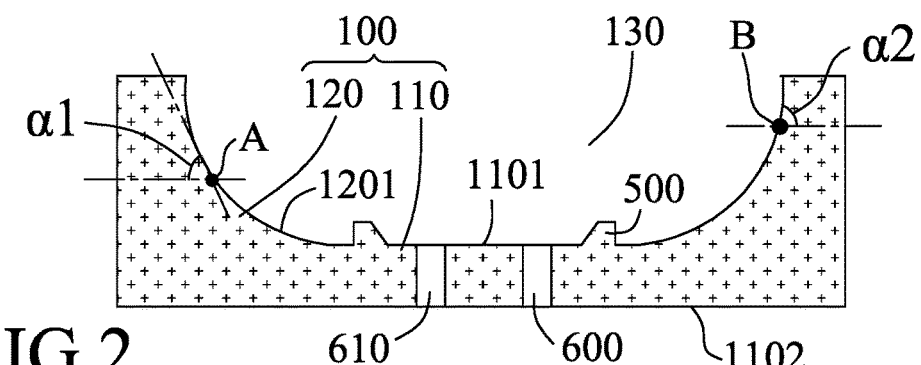
FIG. 2 is a schematic view illustrating a lead frame in the first embodiment.

Referring to FIGS. 1 and 2, a first embodiment of the semiconductor light-emitting device according to the present disclosure includes a lead frame 100, a light-emitting element 200, a reflection layer 300, and a packaging layer 400. The lead frame 100 includes a main body 110 and a side body 120 which are integrally formed into one piece. The main body 110 has a first surface 1101 and a second surface 1102 opposite to the first surface 1101. The side body 120 extends upwardly from the first surface 1101 of the main body 110. The main body 110 and the side body 120 cooperatively define a receiving space 130 for receiving the light-emitting element 200. The side body 120 has an inner surface 1201 facing the receiving space 130. The light-emitting element 200 is disposed on the first surface 1101 of the main body 110 and in the receiving space 130. The reflection layer 300 covers at least a part of the inner surface 1201 of the side body 120. The side body 120 has a first height ($H_1$) measured from the first surface 1101 of the main body 110, and the reflection layer 300 has a second height ($H_2$) measured from the first surface 1101 of the main body 110. The second height ($H_2$) is not smaller than 90% of the first height ($H_1$). The packaging layer 400 is formed in the receiving space 130, and encapsulates the light-emitting element 200 and the reflection layer 300. Since area and height of the reflection layer 300 covering the side body 120 are relatively large, light emitted from the light-emitting element 200 and reflected through the reflection layer 300 can be increased, and thus absorption of light emitted from light-emitting element 200 by the lead frame 100 can be alleviated. Thus, the luminous efficiency of the semiconductor light-emitting device according to the present disclosure can be enhanced.

In this embodiment, the lead frame 100 has a first through hole and a second through hole that penetrate the lead frame 100 in a direction from the first surface 1101 of the main body 110 to the second surface 1102 of the main body 110. In addition, the semiconductor light-emitting device further includes a first electrode 600 and a second electrode 610. The first electrode 600 is formed in the first through hole and is electrically connected to the light-emitting element 200, and the second electrode 610 is formed in the second through hole and is electrically connected to the light-emitting element 200.

The inner surface 1201 of the side body 120 may have a curved portion that faces the receiving space 130. In this embodiment, as shown in FIG. 2, the inner surface 1201 of the side body 120 is completely formed into a concave wall (i.e., the curved portion). The curved portion has a slope that increases gradually in a direction from the main body 110 to a topmost end of the side body 120. The curved portion has a height defined between a topmost end of the curved portion and a bottommost end of the curved portion. In some embodiments, the slope at 50% of the height of the curved portion ranges from tan 40° to tan 60°. In such case, a point at 50% of the height of the curved portion is denoted by A, an included angle defined between a tangent line and a horizontal line both passing through point A is denoted by α1, and α1 ranges from 40° to 60°, such that the slope of the curved portion at point A ranges from tan 40° to tan 60°. In some embodiments, the slope at 75% of the height of the curved portion ranges from tan 60° to tan 90°. In such case, the point at 75% of the height of the curved portion is denoted by B, an included angle defined between a tangent line and a horizontal line both passing through point B is denoted by α2, and α2 ranges from 60° to 90°, such that the slope of the curved portion at point B ranges from tan 60° to tan 90°. With the inner surface 1201 of the side body 120 having the abovementioned configuration, the area and height of the reflection layer 300 covering the side body 120 can be increased. In this embodiment, the first height ($H_1$) of the side body 120, the second height ($H_2$) of the reflection layer 300, and the height of the curved portion are defined in a vertical direction.

In some embodiments, the reflection layer 300 completely covers the inner surface 1201 of the side body 120. In such case, the second height ($H_2$) is equal to the first height ($H_1$). In some embodiments, the reflection layer 300 covers a part of the inner surface 1201 of the side body 120. In such case, the second height ($H_2$) is not smaller than 95% of the first height ($H_1$).

In some embodiments, a portion of the reflection layer 300 located at a predetermined height ($H_3$) measured from the first surface 1101 of the main body 110 has a thickness ($D_1$) ranging from 65 μm to 360 μm, and the predetermined height ($H_3$) ranges from 80% to 95% of the first height ($H_1$). In this embodiment, the thickness ($D_1$) of the portion of the reflection layer 300 located at the predetermined height ($H_3$) is not smaller than 110 μm, such as 110 μm, 160 μm, 210 μm, 260 μm, 310 μm, or 360 μm. When the thickness ($D_1$) is not smaller than 110 μm, the reflection layer 300 may have a stronger reflection capability, which is conducive for reflecting light emitted from the light-emitting element 200 and increasing the luminous efficiency of the semiconductor light-emitting device.

For example, when the thickness ($D_1$) is 65 μm, a reflectance of the reflection layer 300 with respect to visible light is greater than 85%.

For another example, when the thickness ($D_1$) is 110 μm, the reflectance of the reflection layer 300 with respect to visible light is greater than 92%.

For yet another example, when the thickness ($D_1$) is 360 μm, the reflectance of the reflection layer 300 with respect to visible light is greater than 95%.

In some embodiments, when the reflection layer 300 includes a filler and a light-transmissive resin, the reflectance of the reflection layer 300 with respect to visible light is greater than 92%. The filler may have a light reflection property or a light scattering property, and may have a particle size larger than a wavelength of light emitted from the light-emitting element 200. The filler may include one of titanium oxide, silicon oxide, zinc oxide, aluminum oxide, zirconia, barium sulfate, and combinations thereof. In some embodiments, the reflection layer 300 is a white glue and is formed on the inner surface 1201 of the side body 120 by one of contact dispensing, non-contact dispensing, and printing.

In some embodiments, the semiconductor light-emitting device may further include a blocking wall 500 disposed on the first surface 1101 of the main body 110 and surrounding the light-emitting element 200. The blocking wall 500 is integrally formed with the lead frame 100. The blocking wall 500 includes a first sidewall and a second sidewall opposite to the first sidewall. The first sidewall is located distal from the light-emitting element 200. The reflection layer 300 covers the first sidewall but is not in contact with the light-emitting element 200. When the reflection layer 300 is formed on the inner surface 1201 of the side body 120, the blocking wall 500 can prevent the reflection layer 300 from diffusing to and covering a sidewall of the light-emitting element 200, so as to avoid the luminous efficiency of light emitted from the light-emitting element 200 being adversely affected. In some embodiments, the blocking wall 500 has a height that is measured from the first surface 1101 of the main body 110 and that ranges from 20 μm to 100 μm.

In some embodiments, the second sidewall has a slanted shape, and a maximum distance ($D_2$) between the light-emitting element 200 and the second sidewall ranges from 0 μm to 50 μm, which is conducive for increasing the area of the reflection layer 300 that covers the first surface 1101 of the main body 110.

In some embodiments, the semiconductor light-emitting device may further include a plurality of metal elements 700 that are disposed between the first surface 1101 of the main body 110 and the light-emitting element 200, and that are spaced apart from each other. In some embodiments, each of the metal elements 700 may have a height (measured from the first surface 1101 of the main body 110) ranging from 20 μm to 100 μm. In this embodiment, the height of each of the metal elements 700 is 60 μm, and the height of the blocking wall 500 is 60 μm.

Figure 3:
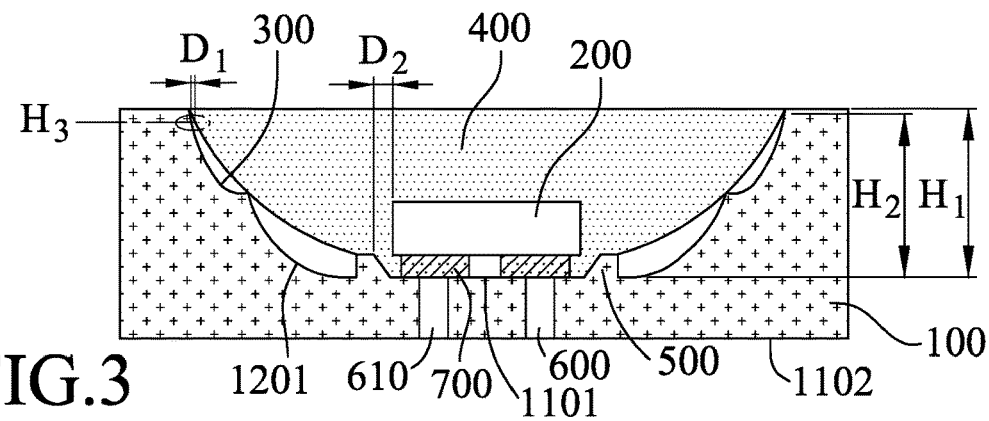
FIG. 3 is a schematic view illustrating a second embodiment of the semiconductor light-emitting device according to the disclosure.
Figure 4:
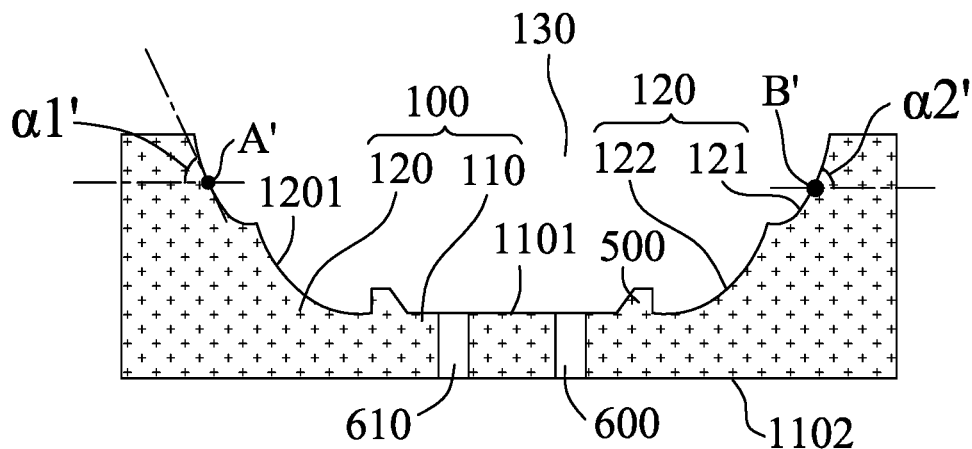
FIG. 4 is a schematic view illustrating a lead frame in the second embodiment.

Referring to FIGS. 3 and 4, a second embodiment of the semiconductor light-emitting device according to the present disclosure is generally similar to the first embodiment, except that, in the second embodiment, the inner surface 1201 of the side body 120 has a first portion 121 and a second portion 122 extending between the first portion 121 and the main body 110.

Specifically, the first portion 121 is located at a top portion of the side body 120, and the second portion 122 is located at a bottom portion of the side body 120. The first portion 121 has a curved shape and faces the receiving space 130. The first portion 121 has a slope increasing gradually in a direction from a bottommost end of the first portion 121 to a topmost end of the first portion 121. The bottommost end of the first portion 121 is connected to the second portion 122, and the topmost end of the first portion 121 is opposite to the bottommost end of the first portion 121 and distal from the second portion 122. The first portion 121 has a height defined between the topmost end of the first portion 121 and the bottommost end of the first portion 121. The slope at 50% of the height of the first portion 121 ranges from tan 40° to tan 60°. In such case, a point of the first portion 121 at 50% of the height of the first portion 121 is denoted by A', an included angle defined between a tangent line and a horizontal line both passing through point A' is denoted by $\alpha 1'$, and $\alpha 1'$ ranges from 40° to 60°, such that the slope of the first portion 121 at point A' ranges from tan 40° to tan 60°. The slope at 75% of the height of the first portion 121 ranges from tan 60° to tan 90°. In such case, a point at 75% of the height of the first portion 121 is denoted by B', an included angle defined between a tangent line and a horizontal line both passing through point B' is denoted by $\alpha 2'$, and $\alpha 2'$ ranges from 60° to 90°, such that the slope of the first portion 121 at point B' ranges from tan 60° to tan 90°.

The reflection layer 300 completely covers the second portion 122, and at least a part of the first portion 121. The second height ($H_2$) is not smaller than 90% of the first height ($H_1$), in which the first height ($H_1$) is equal to a sum of the height of the first portion 121 and a height of the second portion 122. The height of the second portion 122 is defined between a topmost end of the second portion 122 and a bottommost end of the second portion 122. The topmost end of the second portion 122 is connected to the bottommost end of the first portion 121, and the bottommost end of the second portion 122 is connected to the first surface 1101 of the main body 110.

By having the first portion 121 and the second portion 122, and the slope of the first portion 121 increasing gradually in the direction from the bottommost end of the first portion 121 to the topmost end of the first portion 121, the area and height of the reflection layer 300 covering the top portion of the side body 120 can be further increased, thereby ensuring that the reflection layer 300 can cover the side body 120 at a level that is not smaller than 90% of the first height ($H_1$). Thus, the reflection layer 300 has enhanced capability for reflecting light emitted from the light-emitting element 200, so as to reduce the amount of emitted light (i.e., from the light-emitting element 200) absorbed by the lead frame 100 and increase the luminous efficiency of the semiconductor light-emitting device.

In some embodiments, as shown in FIG. 4, the first portion 121 and the second portion 122 cooperate to form a stepwise structure. In such case, each of the first portion 121 and the second portion 122 has a projection on the first surface 1101 of the main body 110, and the projection of the first portion 121 is located outside of the projection of the second portion 122 and away from the light-emitting element 200 relative to the projection of the second portion 122. In addition, the second portion 122 has a curved shape and faces the receiving space 130. The slope of the second portion 122 increases gradually in the direction from the bottommost end of the second portion 122 to the topmost end of the second portion 122, in which the slope of the second portion 122 at 50% of the height of the second portion 122 ranges from tan 40° to tan 60°, and the slope of the second portion 122 at 75% of the height of the second portion 122 ranges from tan 60° to tan 90°.

In some embodiments, the first portion 121 is located at a level that is not smaller than 50% of the first height ($H_1$).

Figure 5:
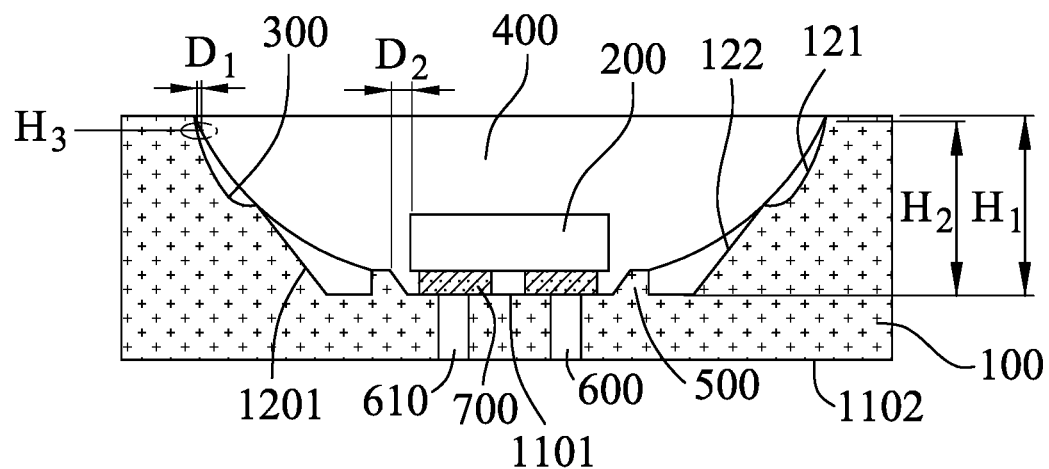
FIG. 5 is a schematic view illustrating a variation of the second embodiment.

In a variation of the second embodiment, as shown in FIG. 5, the second portion 122 has an inclined flat shape (not having a curved shape).

It is noted that the inner surface 1201 of the side body 120 may further have a third portion (not shown) disposed between the first portion 121 and the second portion 122. There is no particular limitation on the structure of the inner surface 1201 of the side body 120, as long as the area and height of the reflection layer 300 covering the top portion of the side body 120 can be increased and the amount of emitted light absorbed by the lead frame 100 can be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A semiconductor light-emitting device, comprising:
a lead frame including a main body and a side body extending upwardly from said main body, said main body and said side body cooperatively defining a receiving space, said side body having an inner surface facing said receiving space, and a first height measured from a surface of said main body to a topmost end of said side body;
a light-emitting element disposed on said surface of said main body and in said receiving space; and
a reflection layer covering at least a part of said inner surface, and having a second height measured from said surface of said main body to a topmost end of said reflection layer, said second height being not smaller than 90% of said first height of said side body, wherein said inner surface has a first portion and a second portion extending between said first portion and said main body, said first portion having a curved shape; and wherein said first portion and said second portion cooperate to form a stepwise structure, each of said first portion and said second portion having a projection on said surface of said main body, the projection of said first portion being located outside of the projection of said second portion and away from said light-emitting element relative to the projection of said second portion.

2. The semiconductor light-emitting device of claim 1, wherein said first portion is located at a level that is not smaller than 50% of said first height.

3. The semiconductor light-emitting device of claim 1, wherein said second portion has a curved shape or an inclined flat shape.

4. The semiconductor light-emitting device of claim 1, further comprising a blocking wall disposed on said surface of said main body and surrounding said light-emitting element, said blocking wall including a first sidewall and a second sidewall opposite to said first sidewall, said first sidewall located distal from said light-emitting element and covered by said reflection layer.

5. The semiconductor light-emitting device of claim 4, wherein a maximum distance between said light-emitting element and said second sidewall ranges from 0 μm to 50 μm.

6. The semiconductor light-emitting device of claim 1, wherein said reflection layer includes a filler and a light-transmissive resin, said filler being selected from the group consisting of titanium oxide, silicon oxide, zinc oxide, aluminum oxide, zirconia, barium sulfate, and combinations thereof.

7. A semiconductor light-emitting device, comprising:
a lead frame including a main body and a side body extending upwardly from said main body, said main body and said side body cooperatively defining a receiving space, said side body having an inner surface facing said receiving space, and a first height measured from a surface of said main body to a topmost end of said side body;
a light-emitting element disposed on said surface of said main body and in said receiving space; and
a reflection layer covering at least a part of said inner surface, and having a second height measured from said surface of said main body to a topmost end of said reflection layer, said second height being not smaller than 90% of said first height of said side body,
wherein a portion of said reflection layer located at a predetermined height measured from said surface of said main body has a thickness ranging from 65 μm to 360 μm, said predetermined height is 80% to 95% of said first height.

8. The semiconductor light-emitting device of claim 7, wherein said thickness of said portion of said reflection layer ranges from 110 μm to 210 μm.

9. The semiconductor light-emitting device of claim 7, wherein said inner surface has a curved portion that has a slope increasing gradually in a direction from said main body to the topmost end of said side body.

10. The semiconductor light-emitting device of claim 7, wherein said inner surface has a curved portion that has a height defined between a topmost end of said curved portion and a bottommost end of said curved portion, said slope at 50% of said height of said curved portion ranges from tan 40° to tan 60°.

11. The semiconductor light-emitting device of claim 7, wherein said inner surface has a curved portion that has a height defined between a topmost end of said curved portion and a bottommost end of said curved portion, said slope at 75% of said height of said curved portion ranges from tan 60° to tan 90°.

12. The semiconductor light-emitting device of claim 7, wherein said inner surface of said side body is completely formed into a concave wall.

13. The semiconductor light-emitting device of claim 7, further comprising a blocking wall disposed on said surface of said main body and surrounding said light-emitting element, said blocking wall including a first sidewall and a second sidewall opposite to said first sidewall, said first sidewall located distal from said light-emitting element and covered by said reflection layer.

14. The semiconductor light-emitting device of claim 7, wherein said reflection layer includes a filler and a light-transmissive resin, said filler being selected from the group consisting of titanium oxide, silicon oxide, zinc oxide, aluminum oxide, zirconia, barium sulfate, and combinations thereof.

15. A semiconductor light-emitting device, comprising:
a lead frame including a main body and a side body extending upwardly from said main body, said main body and said side body cooperatively defining a receiving space, said side body having an inner surface facing said receiving space, and a first height measured from a surface of said main body to a topmost end of said side body, said inner surface having a curved portion that has a slope increasing gradually in a direction from said main body to said topmost end of said side body and that has a height defined between a topmost end of said curved portion and a bottommost end of said curved portion, said slope at 50% of said height of said curved portion ranging from tan 40° to tan 60°;
a light-emitting element disposed on said surface of said main body and in said receiving space; and
a reflection layer covering at least a part of said inner surface, and having a second height measured from said surface of said main body to a topmost end of said reflection layer, said second height being not smaller than 90% of said first height.

16. The semiconductor light-emitting device of claim 15, wherein a portion of said reflection layer located at a predetermined height measured from said surface of said main body has a thickness ranging from 65 μm to 360 μm, said predetermined height ranging from 80% to 95% of said first height.

17. The semiconductor light-emitting device of claim 16, wherein said thickness of said portion of said reflection layer ranges from 110 μm to 210 μm.

18. The semiconductor light-emitting device of claim 15, wherein said slope at 75% of said height of said curved portion ranges from tan 60° to tan 90°.

19. The semiconductor light-emitting device of claim 15, wherein said inner surface of said side body is completely formed into a concave wall.

20. The semiconductor light-emitting device of claim 15, wherein said inner surface has a first portion and a second portion extending between said first portion and said main body, said first portion having a curved shape.

* * * * *